United States Patent
Yabe et al.

(10) Patent No.: US 9,967,083 B2
(45) Date of Patent: May 8, 2018

(54) RECEIVING DEVICE

(71) Applicant: Toshiba Memory Corporation, Tokyo (JP)

(72) Inventors: Hiroo Yabe, Tokyo (JP); Masayuki Usuda, Tokyo (JP); Masashi Nakata, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days. days.

(21) Appl. No.: 15/439,729

(22) Filed: Feb. 22, 2017

(65) Prior Publication Data

US 2018/0069689 A1    Mar. 8, 2018

(30) Foreign Application Priority Data

Sep. 5, 2016  (JP) .................... 2016-173052

(51) Int. Cl.
| | |
|---|---|
| *H04B 1/38* | (2015.01) |
| *H04L 7/00* | (2006.01) |
| *H03K 5/156* | (2006.01) |
| *H04L 7/033* | (2006.01) |
| *H04B 1/40* | (2015.01) |

(52) U.S. Cl.
CPC ......... *H04L 7/0025* (2013.01); *H03K 5/1565* (2013.01); *H04B 1/40* (2013.01); *H04L 7/0331* (2013.01)

(58) Field of Classification Search
CPC .................................................... H04L 7/0025
USPC ............................................................ 375/219
See application file for complete search history.

(56) References Cited

U.S. PATENT DOCUMENTS

| | | |
|---|---|---|
| 6,549,571 B1 | 4/2003 | Baba |
| 8,451,967 B2 | 5/2013 | Xu |

FOREIGN PATENT DOCUMENTS

JP          H10-38907         2/1998

*Primary Examiner* — Lihong Yu
(74) *Attorney, Agent, or Firm* — Patterson & Sheridan, LLP

(57) ABSTRACT

A communication device includes a timing generation circuit generates timing signals at several timing points within one period of a first clock signal. A clock sampling circuit receives the first clock signal and detects a logic level of the first clock signal at each of the timing points. A control circuit calculates a difference between the number of times a first or a second logic level is detected for the first clock signal and outputs a control signal indicating whether a duty ratio of the first clock signal is to be adjusted. A correction circuit that changes at a duty ratio of a second clock signal transmitted to the transmitting device, the duty ratio being set in accordance with the control signal. The duty ratio of the first clock signal is then adjusted by the transmitting device according to the duty ratio of the second clock signal.

20 Claims, 8 Drawing Sheets

RECEIVING DEVICE

CROSS-REFERENCE TO RELATED APPLICATION

This application is based upon and claims the benefit of priority from Japanese Patent Application No. 2016-173052, filed Sep. 5, 2016, the entire contents of which are incorporated herein by reference.

FIELD

Embodiments described herein relate generally to a receiving device that performs communication with a transmitting device in synchronization with a clock signal.

BACKGROUND

An existing circuit that detects the duty ratio of a clock signal includes a delay-locked loop (DLL), a charge pump, a capacitor, and so forth.

DETAILED DESCRIPTION

Figure 1:
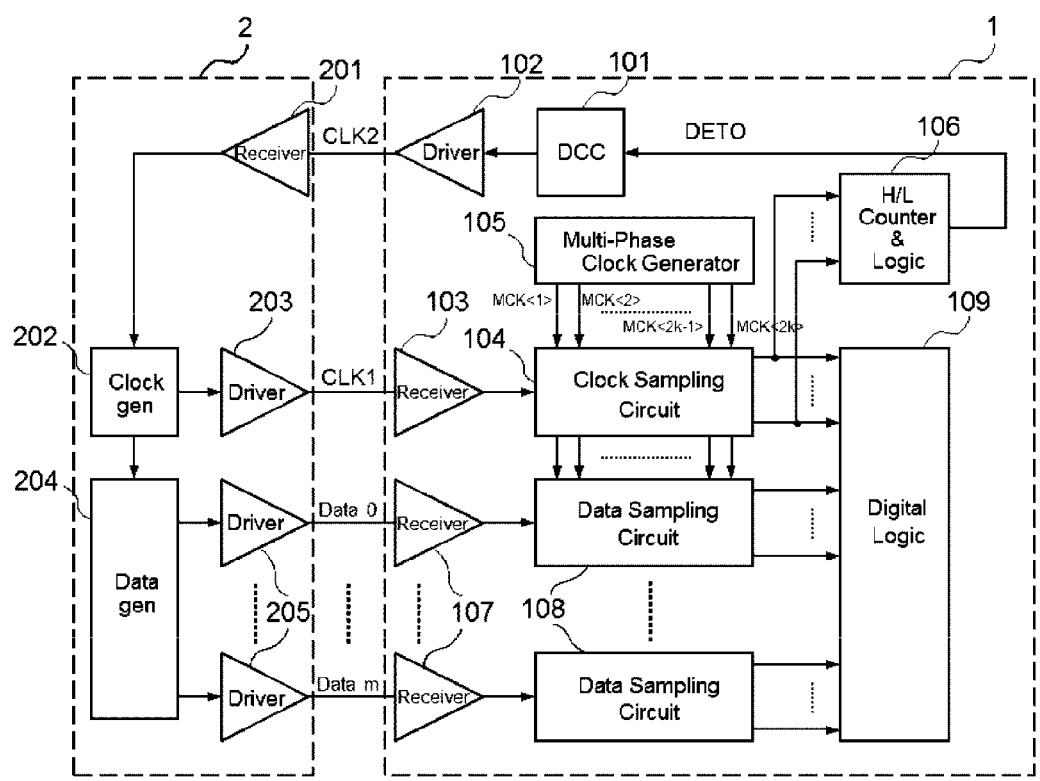
FIG. 1 is a diagram of a communication system including a receiving device according to a first embodiment.

In general, according to one embodiment, a communication device that transmits data to and receives data from a transmitting device, includes a timing generation circuit that is configured to generate timing signals at L timing points, where L is a natural number greater than or equal to 4. Each of the L timing points is within one period (one cycle) of a first clock signal that is transmitted from the transmitting device. A clock sampling circuit is configured to receive the first clock signal from the transmitting device and to detect a logic level of the first clock signal at each of the L timing points in accordance with the timing signals. A control circuit is configured to calculate a difference between the number of times the first clock signal is detected as having a first logic level at the timing points and the number of times the first clock signal is detected as having a second logic level at the timing points. The control circuit is further configured to output a control signal indicating whether a duty ratio of the first clock signal is to be adjusted based on the difference calculated. A correction circuit is configured to change a duty ratio of a second clock signal that is transmitted to the transmitting device in accordance with the control signal output by the control circuit. The duty ratio of the first clock signal is adjusted by the transmitting device according to the duty ratio of the second clock signal.

Hereinafter, embodiments will be described with reference to the drawings. In the following description, component elements having the same function and configuration will be identified with a common reference character.

1. First Embodiment

A receiving device according to a first embodiment will be described.

1.1 Regarding the Configuration of the Receiving Device

First, the configuration of a communication device (also referred to as a receiving device) according to the first embodiment will be described using FIG. 1. FIG. 1 is a configurational diagram of a communication system including a receiving device according to the first embodiment.

As depicted in FIG. 1, the communication system includes a receiving (communication) device 1 and a transmitting device 2. The receiving device 1 includes a duty ratio correction circuit (DCC) 101, a driver 102, a receiver 103, a clock sampling circuit 104, a multi-phase clock generation circuit 105, a control circuit (H/L Counter & Logic) 106, receivers 107, data sampling circuits 108, and a logic circuit (Digital Logic) 109. The transmitting device 2 includes a receiver 201, a clock generation circuit (Clock gen) 202, driver 203, and drivers 205, and a data generation circuit (Data gen) 204.

The duty ratio correction circuit 101 transmits a clock signal CLK2 to the transmitting device 2 via the driver 102. Moreover, as will be described later, the duty ratio correction circuit 101 changes the duty ratio of the clock signal CLK2 in accordance with a duty ratio determination result DETO output from the control circuit 106. Here, the duty ratio is the ratio of a period of time in which the logic level of a clock signal is H level to the total time of one period of the clock signal.

The receiver 201 receives the clock signal CLK2 transmitted by the duty ratio correction circuit 101 and transmits the received clock signal CLK2 to the clock generation circuit 202. The clock generation circuit 202 generates a clock signal CLK1 based on the clock signal CLK2. The duty ratio of the clock signal CLK1 depends on the duty ratio of the clock signal CLK2, and thus the duty ratio correction circuit 101 may correct the duty ratio of the clock signal CLK1 by changing the duty ratio of the clock signal CLK2. The clock generation circuit 202 transmits the clock signal CLK1 to the receiving device 1 via the driver 203.

The receiver 103 receives the clock signal CLK1 transmitted from the transmitting device 2 and transmits this received clock signal CLK1 to the clock sampling circuit 104. The multi-phase clock generation circuit 105 generates 2k (where k is a natural number greater than or equal to 2) multi-phase clock signals (clocks) MCK<1> to MCK<2k> having the same period (frequency) as the clock signal CLK1. The 2k multi-phase clocks MCK<1> to MCK<2k> have phases that are sequentially shifted in one period of the clock signal CLK1. In other words, the multi-phase clock generation circuit 105 generates timing signals setting 2k timing points which are sequentially shifted within the time of one period of the clock signal CLK1.

The clock sampling circuit 104 performs oversampling of the clock signal CLK1 in synchronization with the edges of these 2k multi-phase clocks MCK<1> to MCK<2k>. That is, the clock sampling circuit 104 detects whether the logic level of the clock signal is H (high) level or L (low) level at the 2k timing points which have been set according to the multi-phase clocks MCK<1> to MCK<2k>.

The control circuit 106 counts the number of times the clock sampling circuit 104 detects an H level in the clock signal CLK1 at the above-described 2k timing points. Moreover, the control circuit 106 counts the number of times the clock sampling circuit 104 detects an L level in the clock signal CLK1 at the above-described 2k timing points. The control circuit 106 calculates a difference between the counted number of times the H level was detected and the counted number of times the L level was detected and outputs a duty ratio determination result DETO based on the calculated difference. The duty ratio determination result DETO indicates whether or not is necessary or desirable to change the duty ratio of the clock signal CLK2 by operation(s) of duty ratio correction circuit 101 and, if the duty ratio is to be changed, whether the change in the duty ratio of the clock signal CLK2 should be in a positive direction (increase) or in a negative direction (decrease). Details of a determination of the duty ratio determination result DETO based on the difference will be described later.

The data generation circuit 204 transmits data to the receiving device 1 in synchronization with the clock signal CLK1 generated by the clock generation circuit 202. A data communication path between the transmitting device 2 and the receiving device 1 has a bus width of m+1 bits, and the data generation circuit 204 transmits data to the receiving device 1 via m+1 drivers 205. The receiving device 1 has m+1 receivers 107 respectively corresponding to the drivers 205. The receivers 107 receive the data transmitted by the data generation circuit 204 and transmit this data to the data sampling circuits 108. The data sampling circuits 108 perform oversampling of the data in synchronization with the edges of the 2k multi-phase clocks MCK<1> to MCK<2k>.

The logic circuit 109 may select one particular timing point from among the 2k timing points as an appropriate reception timing point in consideration of aspects such as skew and the like. Then, the logic circuit 109 processes the data received by the data sampling circuits 108 at the selected timing point.

1.2 Regarding the Operation of the Receiving Device

Figure 2:
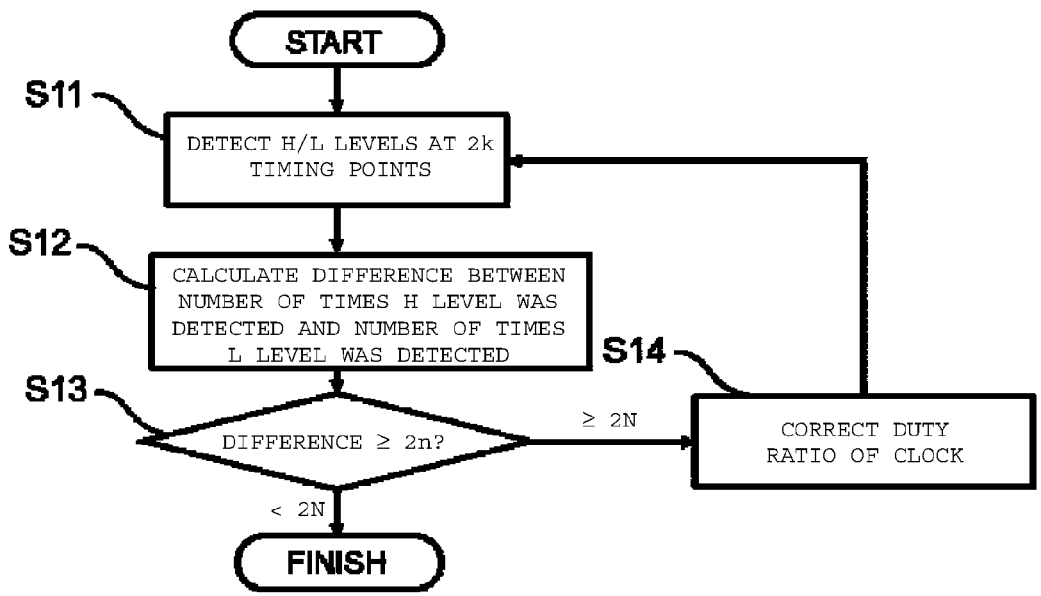
FIG. 2 is a flowchart depicting aspects of a duty ratio correction operation of a receiving device according to the first embodiment.

Next, a duty ratio correction operation of the receiving device according to the first embodiment will be described by using FIG. 2. FIG. 2 is a flowchart depicting the duty ratio correction operation of the receiving device according to the first embodiment.

First, the clock sampling circuit 104 performs oversampling of the clock signal CLK1 at the 2k timing points in synchronization with the 2k multi-phase clocks MCK<1> to MCK<2k>. That is, the clock sampling circuit 104 detects whether the logic level of the clock signal CLK1 is H level or L level at each of the 2k timing points (Step S11).

Next, the control circuit 106 calculates a difference between the number of times the clock sampling circuit 104 detected the H level and the number of times the clock sampling circuit 104 detected the L level at the 2k timing points (Step S12). The difference calculated in Step S12 may be positive of negative.

The control circuit 106 determines whether or not an absolute value of the difference calculated in Step S12 is greater than or equal to 2n (where n is a natural number that satisfies the relationship n<k) (Step S13). If the absolute value of the difference calculated in Step S12 is greater than or equal to 2n, the control circuit 106 determines that correction of the clock signal CLK1 is to be performed. Furthermore, if the difference calculated in Step S12 is positive (or if the duty ratio of the clock signal CLK1 is greater than a predetermined value), the control circuit 106 outputs the duty ratio determination result DETO indicating that the duty ratio of the clock signal CLK2 is to be changed in the negative direction. On the other hand, if the difference calculated in Step S12 is negative (or if the duty ratio of the clock signal CLK1 is smaller than the predetermined value), the control circuit 106 outputs the duty ratio determination result DETO indicating that the duty ratio of the clock signal CLK2 is to be changed in the positive direction.

The duty ratio correction circuit 101 changes the duty ratio of the clock signal CLK2 in accordance with the duty ratio determination result DETO. As a result, the duty ratio of the clock signal CLK1 is corrected (Step S14). As noted, the duty ratio of the clock signal CLK1 depends on the duty ratio of the clock signal CLK2. Therefore, as a result of the duty ratio correction circuit 101 increasing the duty ratio of the clock signal CLK2, the duty ratio of the clock signal CLK1 increases. Likewise, as a result of the duty ratio correction circuit 101 reducing the duty ratio of the clock signal CLK2, the duty ratio of the clock signal CLK1 reduces. After the execution of Step S14, the Steps S11 to S13 can be performed again.

If a determination is made in Step S13 that the absolute value of the difference calculated in Step S12 is less than 2n, the duty ratio correction operation is ended.

As a result of correction of the duty ratio of the clock signal CLK1 being performed until the difference between the number of times H level of the clock signal CLK1 is detected and the number of times L level of the clock signal CLK1 is detected becomes less than 2n, the duty ratio of the clock signal CLK1 is adjusted so as to be within a range between 50+100 (n−1)/2k and 50+100(n+1)/2k.

Figure 3:
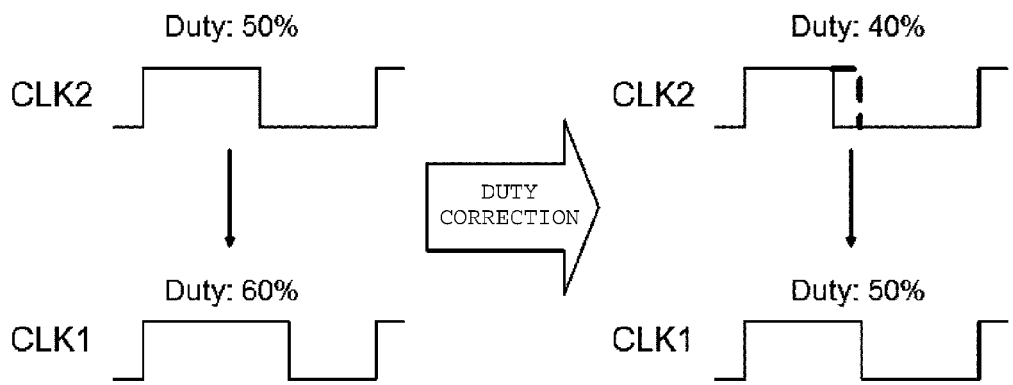
FIG. 3 is a diagram explaining aspects related to overcorrection of a duty ratio.

Here, the duty ratio of the clock signal CLK1 at the time of maximum correction in the duty ratio correction circuit 101 is 50+100×n/2k. The values of k and n are determined such that this duty ratio at the time of maximum correction is not an over-correction. With reference to FIG. 3, overcorrection of a duty ratio will be described. The left (page direction) side of FIG. 3 indicates the duty ratio of the clock signal CLK1 before correction, and the right (page direction) side of FIG. 3 indicates the duty ratio of the clock signal CLK1 after correction.

An example on the left side of FIG. 3 depicts a case where the duty ratio of the clock signal CLK1 is 60%. If a correction is made such that the duty ratio of the clock signal CLK1 becomes 50%, as indicated on the right side of FIG. 3, the duty ratio of the clock signal CLK2 has to be changed from 50% to 40%. At this time, if the duty ratio of the clock signal CLK2 which is required from the viewpoint of the specifications of the receiver 201 is 45 to 55%, for example, there is a possibility that the clock signal CLK2 will not be properly received by the receiver 201. Therefore, when the values of k and n are determined, a difference between the duty ratio (50+100×n/2k) of the clock signal CLK1 at the time of maximum correction and the duty ratio of the clock signal CLK1 before correction is calculated, and the changed duty ratio of the clock signal CLK2 is checked to see whether or not the duty ratio satisfies the specifications of the duty ratio which are required by the transmitting device 2.

Figure 4:
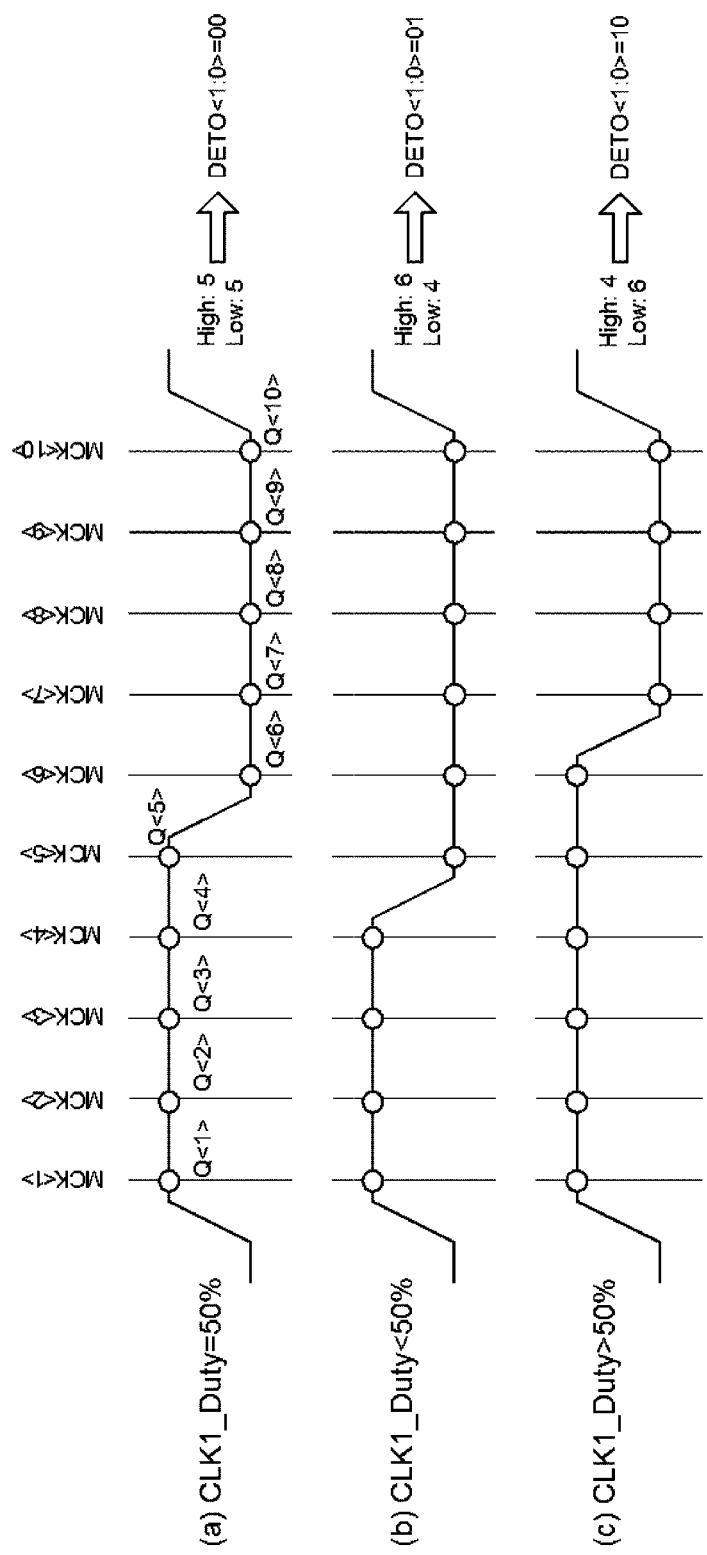
FIG. 4 is a diagram for explaining aspects related to an oversampling result and a duty ratio determination result of a receiving device according to the first embodiment.

Next, an oversampling result and the duty ratio determination result of the receiving device according to the first embodiment will be described by using FIG. 4. FIG. 4 depicts a case where 2k=10 and 2n=2.

Part (a) of FIG. 4 depicts a case where the duty ratio of the clock signal CLK1 is 50%. The clock sampling circuit 104 detects the H level at the timing points of MCK<1> to MCK<5> and detects the L level at the timing points of MCK<6> to MCK<10>. Thus, the number of times H level was detected and the number of times L level was detected are each five and a difference between the number of H levels and the number of L levels detected is zero (0). The control circuit 106 therefore sets DETO<1:0>=00 which provides the duty ratio correction circuit 101 with an indication that correction of the duty ratio of the clock signal CLK1 is unnecessary at this time.

Part (b) of FIG. 4 depicts a case where the duty ratio of the clock signal CLK1 is less than 50%. The clock sampling circuit 104 detects the H level at the timing points of MCK<1> to MCK<4> and detects the L level at the timing points of MCK<5> to MCK<10>. Here, the number of times H level was detected is four and the number of times L level was detected is six for a difference of −2. Since the absolute value of this difference (−2) is greater than or equal to 2, the control circuit 106 sets DETO<1:0>=01 which provides the duty ratio correction circuit 101 with an indication that the duty ratio of the clock signal CLK2 is to be changed in the positive direction.

Part (c) of FIG. 4 depicts a case where the duty ratio of the clock signal CLK1 is greater than 50%. The clock sampling circuit 104 detects the H level at the timing points of MCK<1> to MCK<6> and detects the L level at the timing points of MCK<7> to MCK<10>. Here, the number of times H level was detected is six and the number of times L level was detected is four, and a difference between the number of times H level was detected and the number of times L level was detected is 2. Since the difference (2) is greater than or equal to 2, the control circuit 106 sets DETO<1:0>=10 which provides the duty ratio correction circuit 101 with an indication that the duty ratio of the clock signal CLK2 is to be changed in the negative direction.

1.3 Effects of the First Embodiment

By limiting an object whose duty ratio is to be corrected, the receiving device 1 according to the first embodiment can prevent a situation in which the duty ratio of the clock signal CLK2 does not satisfy the requirements of the duty ratio of the clock signal CLK2 from the viewpoint of the specifications of the transmitting device 2.

Specifically, the receiving device 1 according to the first embodiment calculates a difference between the number of times H level was detected and the number of times L level was detected and corrects the duty ratio of the clock signal CLK1 only if the absolute value of the difference becomes 2n or more. In other words, even when the duty ratio of the clock signal CLK1 deviates from 50%, the receiving device 1 according to the first embodiment does not correct the duty ratio of the clock signal CLK1 so long as the absolute value of the difference remains less than 2n. As a result, as compared to a case in which the duty ratio of the clock signal CLK1 is corrected regardless of the magnitude of deviation of the duty ratio of the clock signal CLK1, the duty ratio to be corrected is limited to cases in which the difference is substantial.

Figure 5:
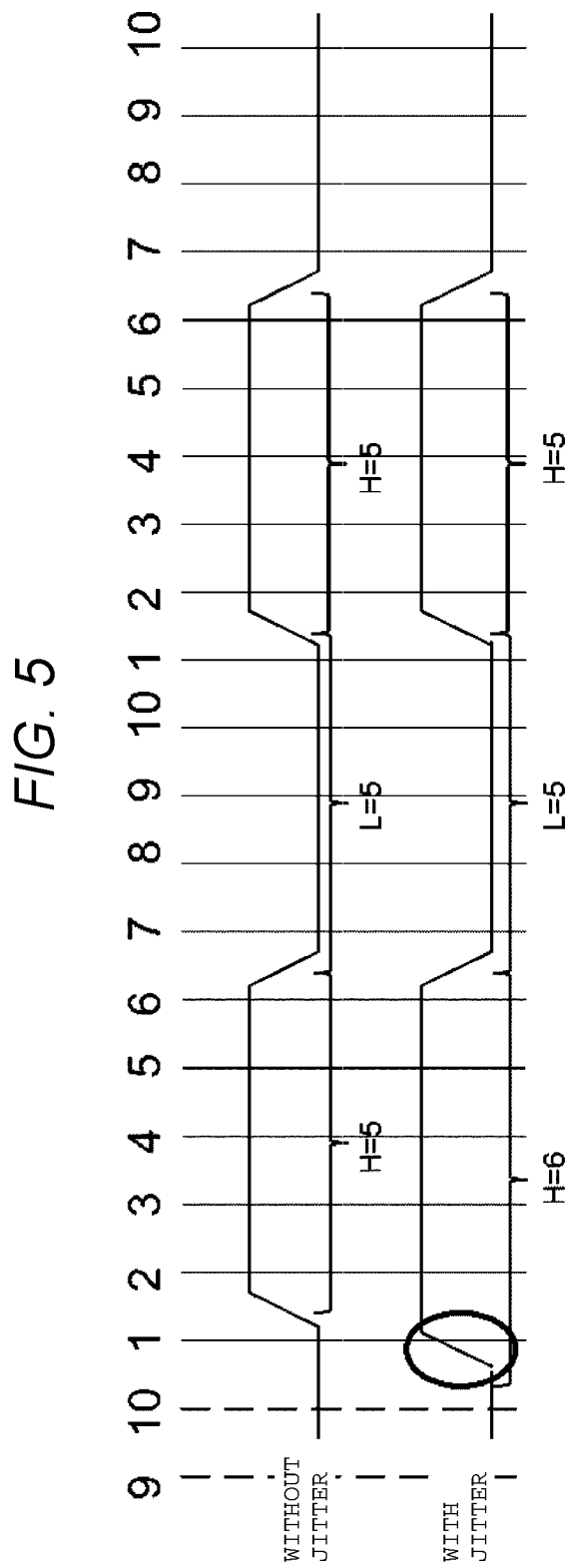
FIG. 5 is a diagram for explaining aspects related to fluctuations in a duty ratio caused by jitter.

Moreover, the receiving device 1 according to the first embodiment can prevent the duty ratio from being corrected (over-corrected) due to temporary fluctuations in a duty ratio caused by jitter. FIG. 5 is an explanatory diagram depicting the fluctuations in a duty ratio caused by jitter. The upper side of FIG. 5 indicates the waveform of the clock signal CLK1 when there is no jitter, and the lower side of FIG. 5 indicates a case where jitter occurs in a first period of the clock signal CLK1 and the period of time during which the clock signal CLK1 is at H level in the first period is lengthened due to the occurrence of the jitter.

As a method for detecting whether or not correction of a duty ratio is necessary, making a determination as to whether or not the number of times any one of H level and L level was detected exceeds a predetermined threshold value is possible. For example, in the example depicted on the lower side of FIG. 5, due to the occurrence of jitter, H level of the clock signal CLK1 is detected six times and L level is detected five times. If the design was selected such that the duty ratio of the clock signal CLK1 is corrected when the number of times the H level was detected exceeds five, the duty ratio of the clock signal CLK1 will be reduced by about 10%. However, as depicted in FIG. 5, since the occurrence of jitter is a temporary event which occurred only in the first period, the duty ratio of the clock signal CLK1 in a second period may be detected as 50% and thus correction of the duty ratio is unnecessary. In such a case, if correction of the duty ratio in accordance with the result of detection of the duty ratio in the first period was performed in the second period, the duty ratio in the second period may be undesirably an unnecessarily disturbed.

On the other hand, the receiving device 1 according to the first embodiment corrects the duty ratio of the clock signal CLK1 only if the absolute value of a difference between the number of times H level was detected and the number of times L level was detected exceeds 2n. Thus, since a difference of only 1 was caused by jitter in FIG. 5, the receiving device 1 according to the first embodiment does not correct the duty ratio of the clock signal CLK1 as a result of the variation due to jitter. As a result, the receiving device 1 according to the first embodiment would not disturb the duty ratio of the clock signal CLK1 in the second period for the case depicted in FIG. 5.

Furthermore, if a determination were to be made based on whether or not the number of times of any one of the H level and the L level was detected during a single period (clock cycle) exceeds the predetermined threshold value, then predetermined threshold value might have to be adjusted each time the period of the clock signal CLK1 or the sampling value (2k) was changed. However, since the receiving device 1 according to the first embodiment compares a difference between the number of times the H level was detected and the number of times the L level was detected with 2n, there is no requirement to change 2n even when sampling value (2k) or the period of the clock signal CLK1 is changed, which facilitates the selection and use of the threshold value (2n).

In addition, the receiving device 1 according to the first embodiment performs oversampling of the clock signal CLK1 by using the same timing signals (the clock signals MCK<1> to MCK<2k>) which the data sampling circuit 104 uses. Oversampling of data is widely used in a high-speed transmission system. By sharing the timing signals used for oversampling of data and for oversampling of the clock signal CLK1, the size of an additional circuit which would otherwise be necessary for performing oversampling of the clock signal CLK1 can be reduced.

2. Second Embodiment

Figure 6:
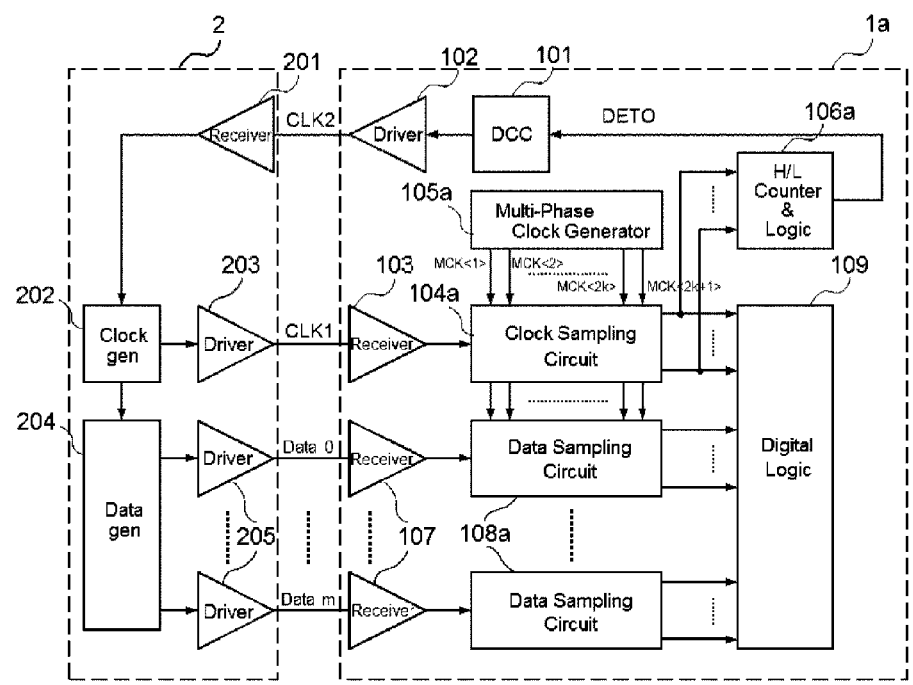
FIG. 6 is a diagram of a communication system including a receiving device according to a second embodiment.

A receiving device according to a second embodiment will be described. In the first embodiment, the logic level of the clock signal CLK1 is detected at even-numbered (2k)

timing points within one period of the clock signal CLK1. On the other hand, the receiving device according to the second embodiment detects the logic level of the clock signal CLK1 at odd-numbered (2k+1) timing points. Hereinafter, by using FIG. 6, descriptions will be given with attention given to differences in the second embodiment from the first embodiment.

2.1 Regarding the Configuration of the Receiving Device

A receiving device 1a according to the second embodiment includes a clock sampling circuit 104a, a multi-phase clock generation circuit 105a, a control circuit 106a, and data sampling circuits 108a along with other components as such were described in conjunction with FIG. 1.

The multi-phase clock generation circuit 105a generates 2k+1 (where k is a natural number greater than or equal to 2) multi-phase clocks MCK<1> to MCK<2k+1> having the same period (frequency) as the clock signal CLK1, the 2k+1 multi-phase clocks MCK<1> to MCK<2k+1> whose phases are sequentially shifted within one period of the clock signal CLK1. In other words, the multi-phase clock generation circuit 105a generates timing signals setting 2k+1 timing points which are sequentially shifted within the time of one period of the clock signal CLK1.

The clock sampling circuit 104a performs oversampling of the clock signal CLK1 in synchronization with the edges of these 2k+1 multi-phase clocks MCK<1> to MCK<2k+1>. That is, the clock sampling circuit 104a detects whether the logic level of the clock signal is the H level or the L level at each of the 2k+1 timing points set by the multi-phase clocks MCK<1> to MCK<2k+1>.

The control circuit 106a counts the number of times the clock sampling circuit 104a has detected the H level at the above-described 2k+1 timing points. The control circuit 106a also counts the number of times the clock sampling circuit 104a has detected the L level at the above-described 2k+1 timing points. The control circuit 106a calculates a difference between the counted number of times for the H level and the counted number of times for the L level and outputs a duty ratio determination result DETO based on the difference. The details of this determination of the duty ratio determination result DETO based on the difference will be described later.

The data sampling circuits 108a perform oversampling of data in synchronization with the edges of the 2k+1 multi-phase clocks MCK<1> to MCK<2k+1>. The logic circuit 109 performs processing of the data which the data sampling circuits 108a received at an appropriate reception timing point which is selected with consideration given to skew and the like.

2.2 Regarding the Operation of the Receiving Device

Figure 7:
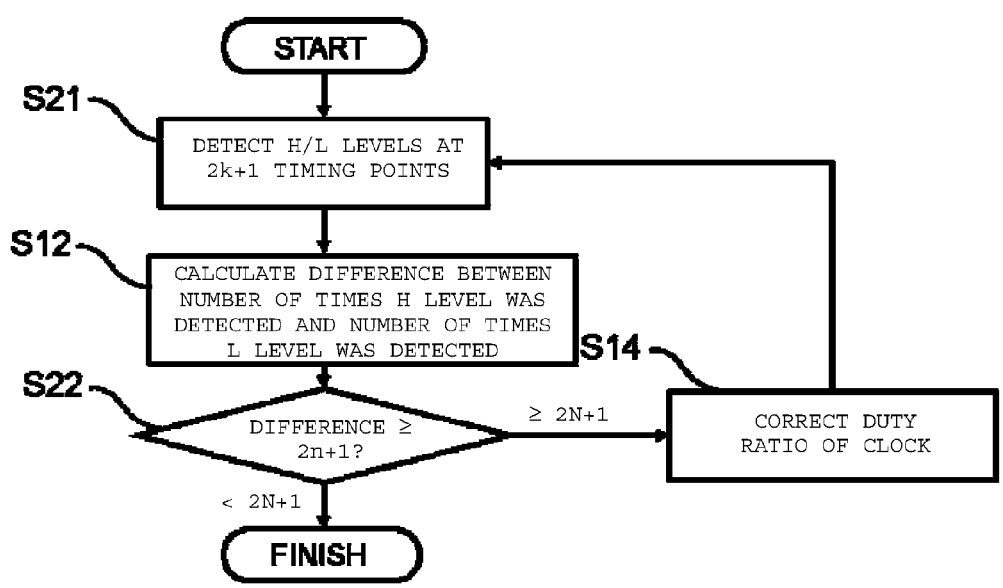
FIG. 7 is a flowchart depicting aspects of a duty ratio correction operation of a receiving device according to the second embodiment.

Next, a duty ratio correction operation of the receiving device according to the second embodiment will be described. FIG. 7 is a flowchart depicting the duty ratio correction operation of the receiving device according to the second embodiment.

First, the clock sampling circuit 104a performs oversampling of the clock signal CLK1 at 2k+1 timing points in synchronization with the 2k+1 multi-phase clocks MCK<1> to MCK<2k+1>. That is, the clock sampling circuit 104a detects whether the logic level of the clock signal CLK1 is H level or L level at each of 2k+1 timing points (Step S21).

Next, the control circuit 106a calculates a difference between the number of times the clock sampling circuit 104a detected the H level and the number of times the clock sampling circuit 104a detected the L level for the 2k+1 timing points (Step S12).

The control circuit 106a determines whether or not the absolute value of the difference calculated in Step S12 is greater than or equal to 2n+1 (where n is a natural number that satisfies n≤k) (Step S22). If the absolute value of the difference calculated in Step S12 is greater than or equal to 2n+1, the control circuit 106a determines that correction of the clock signal CLK1 is to be performed. Specifically, if the difference calculated in Step S12 is positive (if the duty ratio of the clock signal CLK1 is greater than a predetermined value), the control circuit 106a outputs a duty ratio determination result DETO to the duty ratio correction circuit 101 indicating that the duty ratio of the clock signal CLK2 is to be changed in the negative direction. On the other hand, if the difference calculated in Step S12 is negative (if the duty ratio of the clock signal CLK1 is less than the predetermined value), the control circuit 106a outputs a duty ratio determination result DETO to the duty ratio correction circuit 101 indicating that the duty ratio of the clock signal CLK2 is to be changed in the positive direction.

The duty ratio correction circuit 101 changes the duty ratio of the clock signal CLK2 in accordance with the duty ratio determination result DETO (Step S14). After the execution of Step S14, Steps S21, S12, and S22 (calculation of a difference between the number of times H level of the clock signal CLK1 was detected and the number of times L level of the clock signal CLK1 was detected and a comparison of the difference to 2n+1) are performed again.

If the determination is made in a Step S22 is that the absolute value of the difference calculated in Step S12 is less than 2n+1, the duty ratio correction operation is ended.

As described above, as a result of correction of the duty ratio of the clock signal CLK1 being performed until the difference between the number of times H level of the clock signal CLK1 was detected and the number of times L level of the clock signal CLK1 was detected becomes less than 2n+1, the duty ratio of the clock signal CLK1 is adjusted so as to be within a range between $50+\{50+100(n-1)\}/2k$ and $50+\{50+100(n+1)\}/2k$.

Here, the duty ratio of the clock signal CLK1 at the time of maximum correction in the duty ratio correction circuit 101 is $50+(50+100\times n)/2k$. Also in the second embodiment, as in the case of the first embodiment, the values of k and n are determined such that this duty ratio at the time of maximum correction is not an over-correction.

Figure 8:
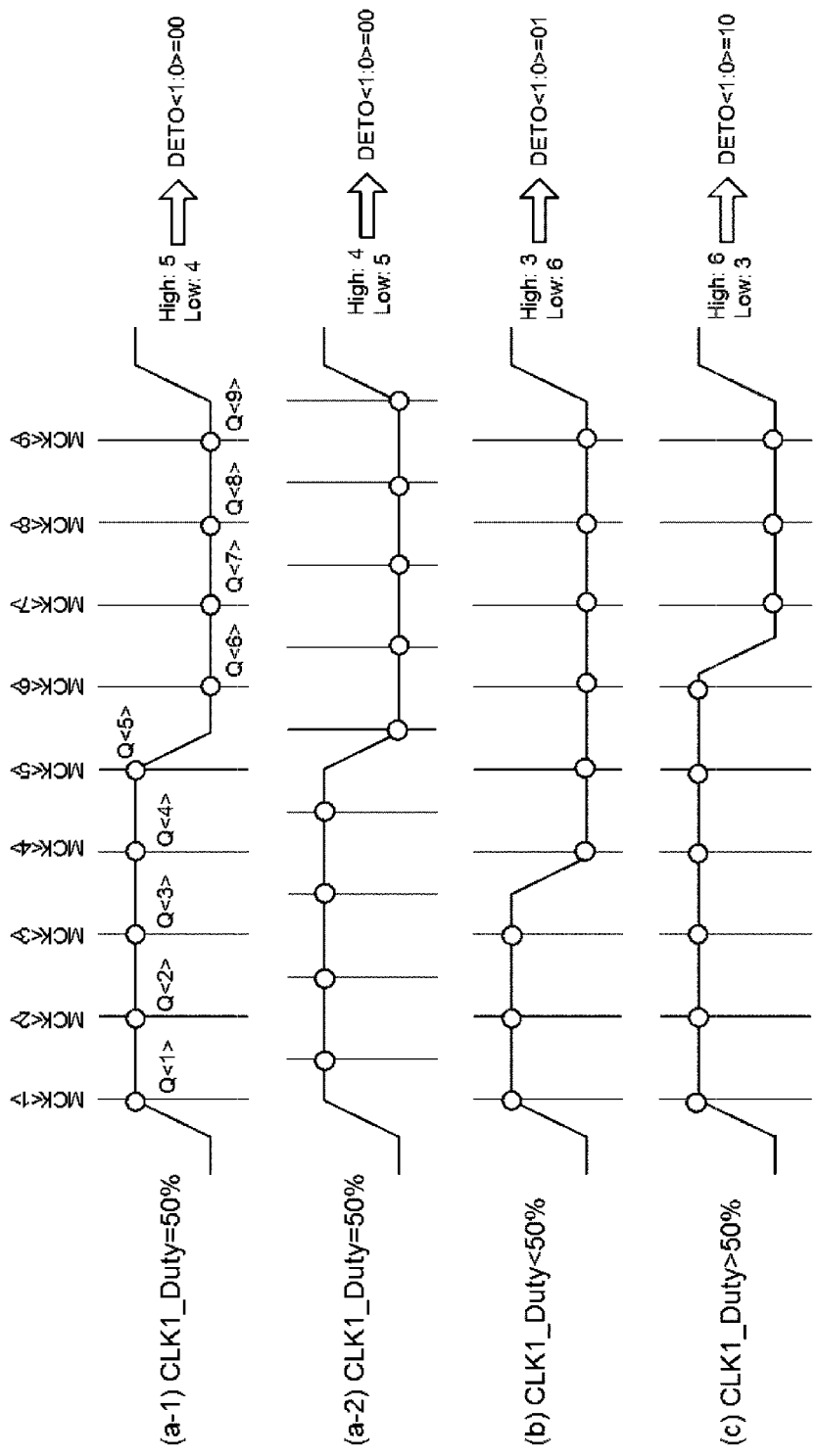
FIG. 8 is a diagram for explaining aspects related to an oversampling result and a duty ratio determination result of a receiving device according to the second embodiment.

Next, the oversampling result and the duty ratio determination result of the receiving device according to the second embodiment will be described. FIG. 8 depicts a case where 2k+1=9 and 2n+1=3.

Parts (a–1) and (a–2) of FIG. 8 depict a case where the duty ratio of the clock signal CLK1 is 50%. In part (a–1) of FIG. 8, the clock sampling circuit 104a detects H levels at the timing points of MCK<1> to MCK<5>. The clock sampling circuit 104a detects L levels at the timing points of MCK<6> to MCK<9>. Thus, the number of times H level is detected is five and the number of times L level is detected is four, and a difference between the number of detected H levels and the number of detected L levels is detected is 1. The control circuit 106a sets DETO<1:0>=00 and provides the duty ratio correction circuit 101 with an indication that correction of the duty ratio of the clock signal CLK1 is unnecessary.

In part (a–2) of FIG. 8, the clock sampling circuit 104a detects H levels at the timing points of MCK<1> to MCK<4>. The clock sampling circuit 104a detects L levels at the timing points of MCK<5> to MCK<9>. The number of times H level is detected is four and the number of times L level is detected is five, and a difference between these detected numbers −1. The control circuit 106a sets DETO<1:0>=00 and provides the duty ratio correction circuit 101 with an indication that correction of the duty ratio of the clock signal CLK1 is unnecessary.

Part (b) of FIG. 8 depicts a case where the duty ratio of the clock signal CLK1 is less than 50%. The clock sampling circuit 104a detects H levels at the timing points of MCK<1> to MCK<3>. The clock sampling circuit 104a detects L levels at the timing points of MCK<4> to MCK<9>. The number of times H level is detected is three and the number of times L level is detected is six, and a difference between these detected numbers is −3. Since the absolute value of the difference is greater than or equal to 3, the control circuit 106a sets DETO<1:0>=01 and provides the duty ratio correction circuit 101 with an indication that the duty ratio of the clock signal CLK2 is to be changed in the positive direction.

Part (c) of FIG. 8 depicts a case where the duty ratio of the clock signal CLK1 is greater than 50%. The clock sampling circuit 104a detects H levels at the timing points of MCK<1> to MCK<6>. The clock sampling circuit 104a detects L levels at the timing points of MCK<7> to MCK<9>. The number of times H level is detected is six and the number of times L level is detected is three, and a difference detected numbers is 3. Since the difference is greater than or equal to 3, the control circuit 106a sets DETO<1:0>=10 and provides the duty ratio correction circuit 101 with an indication that the duty ratio of the clock signal CLK2 is to be changed in the negative direction.

2.3 Effects of the Second Embodiment

The receiving device 1a according to the second embodiment detects the logic level of the clock signal CLK1 at an odd-numbered (2k+1) timing points also has effects similar to the effects of the receiving device 1 described in the first embodiment.

3. Modified Example

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the present disclosure.

For example, in the first embodiment, the multi-phase clock generation circuit 105 generates 2k timing signals (MCK<1> to MCK<2k>); however, instead, the timing signals may not be generated in one circuit but rather may be generated in stages by a plurality of circuits.

Figure 9:
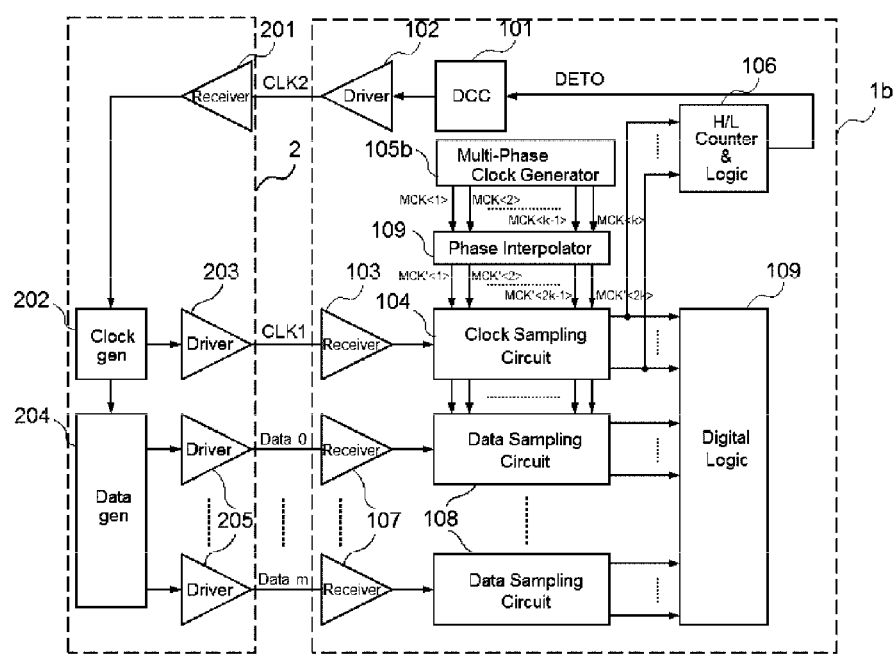
FIG. 9 is a diagram of a communication system including a receiving device according to a modified example of the first embodiment.

FIG. 9 is a configuration diagram of a communication system including a receiving device according to a modified example of the first embodiment. As compared to the receiving device 1 according to the first embodiment, a receiving device 1b according to this modified example has a multi-phase clock generation circuit 105b and a phase interpolation circuit (Phase Interpolator) 109 in place of the multi-phase clock generation circuit 105. The multi-phase clock generation circuit 105b generates k multi-phase clock MCK<1> to MCK<k> having the same period (frequency) as the clock signal CLK1, the k multi-phase clock MCK<1> to MCK<k> whose phases are sequentially shifted in one period of the clock signal CLK1. The phase interpolation circuit 109 generates an intermediate phase from each of the k clock signals MCK<1> to MCK<k> and generates 2k clock signals MCK'<1> to MCK'<2k>. As described above, the 2k timing signals may be generated in stages by the multi-phase clock generation circuit 105b and the phase interpolation circuit 109.

Moreover, in the first and second embodiments, the multi-phase clocks having the same period as the clock signal CLK1 are used as the timing signals, but the timing signals are not limited thereto. The timing signals simply have to be timing signals that set L (L is a natural number greater than or equal to 4) timing points which are sequentially shifted within the time of one period of the clock signal CLK1. For example, clock signals having a frequency which is N times higher than the frequency of the clock signal CLK1 may be generated by using a phase-locked loop (PLL) or an oscillator and used as the timing signals.

What is claimed is:

1. A communication device that transmits data to and receives data from a transmitting device, the communication device comprising:
   a timing generation circuit configured to generate timing signals at L timing points, where L is a natural number greater than or equal to 4, each of the L timing points being within one period of a first clock signal;
   a clock sampling circuit configured to receive the first clock signal from the transmitting device and to detect a logic level of the first clock signal at each of the L timing points in accordance with the timing signals;
   a control circuit configured to calculate a difference between the number of times the first clock signal is detected as having a first logic level at the timing points and the number of times the first clock signal is detected as having a second logic level at the timing points, the control circuit further configured to output a control signal indicating whether a duty ratio of the first clock signal is to be adjusted based on the difference calculated; and
   a correction circuit configured to change a duty ratio of a second clock signal that is output to the transmitting device in accordance with the control signal output by the control circuit, the duty ratio of the first clock signal being adjusted by the transmitting device according to the duty ratio of the second clock signal.

2. The communication device according to claim 1, further comprising:
   a data sampling circuit configured to receive data from the transmitting device in synchronization with the first clock signal and to perform sampling of the data at each of the L timing points based on the timing signals.

3. The communication device according to claim 2, further comprising:
   a processing circuit configured to select one particular timing point from among the L timing points as a data signal for subsequent processing.

4. The communication device according to claim 1, wherein the timing generation circuit includes:
   a clock generation circuit configured to generate M multi-phase clock signals to provide M timing points within a period of the first clock signal, where M is a natural number and satisfies M=L/2, and
   a clock phase interpolation circuit configured to generate the timing signals from the M multi-phase clock signals.

5. The communication device according to claim 4, wherein
L is an even number, and
the correction circuit is configured to change the duty ratio of the second clock signal if the difference between the number of times the first clock signal is detected as having the first logic level at the timing points and the number of times the first clock signal is detected as having the second logic level at the timing points is greater than or equal to N, where N is greater than or equal to 2 and satisfies N<L.

6. The communication device according to claim 4, wherein
L is an odd number, and
the correction circuit is configured to change the duty ratio of the second clock signal if the difference between the number of times the first clock signal is detected as having the first logic level at the timing points and the number of times the first clock signal is detected as having the second logic level at the timing points is greater than or equal to N, where N is greater than or equal to 3 and satisfies N<L.

7. The communication device according to claim 1, wherein
L is an even number, and
the correction circuit is configured to change the duty ratio of the second clock signal if the difference between the number of times the first clock signal is detected as having the first logic level at the timing points and the number of times the first clock signal is detected as having the second logic level at the timing points is greater than or equal to N, where N is greater than or equal to 2 and satisfies N<L.

8. The communication device according to claim 1, wherein
L is an odd number, and
the correction circuit is configured to change the duty ratio of the second clock signal if the difference between the number of times the first clock signal is detected as having the first logic level at the timing points and the number of times the first clock signal is detected as having the second logic level at the timing points is greater than or equal to N, where N is greater than or equal to 3 and satisfies N<L.

9. A communication system, comprising:
a transmitting device configured to transmit data and a first clock signal, the first clock signal having a first duty ratio that can be varied;
a receiving device including:
  a timing generation circuit configured to generate timing signals at L timing points, where L is a natural number greater than or equal to 4, each of the L timing points being within one period of the first clock signal;
  a clock sampling circuit configured to receive the first clock signal from the transmitting device and to detect a logic level of the first clock signal at each of the L timing points in accordance with the timing signals;
  a control circuit configured to calculate a difference between the number of times the first clock signal is detected as having a first logic level at the timing points and the number of times the first clock signal is detected as having a second logic level at the timing points, the control circuit further configured to output a control signal indicating whether the first duty ratio of the first clock signal is to be adjusted based on the difference calculated; and
  a correction circuit configured to change a second duty ratio of a second clock signal that is output to the transmitting device in accordance with the control signal output by the control circuit, the first duty ratio of the first clock signal being adjusted by the transmitting device according to the second duty ratio of the second clock signal.

10. The communication system according to claim 9, the receiving device further including:
a data sampling circuit configured to receive data from the transmitting device in synchronization with the first clock signal and to perform sampling of the data at each of the L timing points based on the timing signals.

11. The communication system according to claim 10, the receiving device further including:
a processing circuit configured to select one particular timing point from among the L timing points as a data signal for subsequent processing.

12. The communication system according to claim 9, wherein the timing generation circuit includes:
a clock generation circuit configured to generate M multi-phase clock signals to provide M timing points within a period of the first clock signal, where M is a natural number and satisfies M=L/2, and
a clock phase interpolation circuit configured to generate the timing signals from the M multi-phase clock signals.

13. The communication system according to claim 12, wherein
L is an even number, and
the correction circuit is configured to change the second duty ratio of the second clock signal if the difference between the number of times the first clock signal is detected as having the first logic level at the timing points and the number of times the first clock signal is detected as having the second logic level at the timing points is greater than or equal to N, where N is greater than or equal to 2 and satisfies N<L.

14. The communication system according to claim 12, wherein
L is an odd number, and
the correction circuit is configured to change the second duty ratio of the second clock signal if the difference between the number of times the first clock signal is detected as having the first logic level at the timing points and the number of times the first clock signal is detected as having the second logic level at the timing points is greater than or equal to N, where N is greater than or equal to 3 and satisfies N<L.

15. The communication system according to claim 9, wherein
L is an even number, and
the correction circuit is configured to change the second duty ratio of the second clock signal if the difference between the number of times the first clock signal is detected as having the first logic level at the timing points and the number of times the first clock signal is detected as having the second logic level at the timing points is greater than or equal to N, where N is greater than or equal to 2 and satisfies N<L.

16. The communication system according to claim 9, wherein
L is an odd number, and
the correction circuit is configured to change the second duty ratio of the second clock signal if the difference between the number of times the first clock signal is detected as having the first logic level at the timing points and the number of times the first clock signal is detected as having the second logic level at the timing points is greater than or equal to N, where N is greater than or equal to 3 and satisfies N<L.

17. A communication method, comprising:
transmitting data in synchronization with a first clock signal having a first duty ratio to a receiving device;
generating timing signal at L timing points, where L is a natural number greater than or equal to 4, each of the L timing points being within one period of the first clock signal;
detecting a logic level of the first clock signal received from the transmitting device at each of the L timing points in accordance with the timing signals;
calculating a difference between the number of times the first clock signal is detected as having a first logic level at the timing points and the number of times the first clock signal is detected as having a second logic level at the timing points;
outputting a control signal indicating whether the first duty ratio of the first clock signal is to be adjusted based on the calculated difference between the number of times the first clock signal is detected as having a first logic level at the timing points and the number of times the first clock signal is detected as having a second logic level at the timing points;
changing a second duty ratio of a second clock signal that is output to the transmitting device in accordance with the control signal;
transmitting the second clock signal to the transmitting device; and
adjusting the first duty ratio of the first clock signal according to the second duty ratio of the second clock signal transmitted to the transmitting device.

18. The communication method according to claim 17, further comprising:
receiving data signals from the transmitting device in synchronization with the first clock signal; and
sampling the data signals at each of the L timing points based on the timing signals.

19. The communication system according to claim 17, wherein
L is an even number, and
the second duty ratio of the second clock signal is changed when the difference between the number of times the first clock signal is detected as having the first logic level at the timing points and the number of times the first clock signal is detected as having the second logic level at the timing points is greater than or equal to N, where N is greater than or equal to 2 and satisfies N<L.

20. The communication method according to claim 17, wherein
L is an odd number, and
the second duty ratio of the second clock signal is changed when the difference between the number of times the first clock signal is detected as having the first logic level at the timing points and the number of times the first clock signal is detected as having the second logic level at the timing points is greater than or equal to N, where N is greater than or equal to 3 and satisfies N<L.

* * * * *